United States Patent
Nagaraj

(10) Patent No.: US 10,666,276 B2
(45) Date of Patent: *May 26, 2020

(54) NORMALIZING ERROR SIGNAL IN ANALOG-TO-DIGITAL CONVERTER RUNAWAY STATE

(71) Applicant: TEXAS INSTRUMENTS INCORPORATED, Dallas, TX (US)

(72) Inventor: Krishnaswamy Nagaraj, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/353,711

(22) Filed: Mar. 14, 2019

(65) Prior Publication Data

US 2019/0215002 A1 Jul. 11, 2019

Related U.S. Application Data

(63) Continuation of application No. 15/628,462, filed on Jun. 20, 2017, now Pat. No. 10,277,238.

(60) Provisional application No. 62/453,550, filed on Feb. 2, 2017.

(51) Int. Cl.
*H03M 1/06* (2006.01)
*H03M 1/02* (2006.01)
*H03M 1/34* (2006.01)
*H03M 1/18* (2006.01)
*H03M 1/10* (2006.01)
*H03M 3/00* (2006.01)

(52) U.S. Cl.
CPC ........... *H03M 1/0626* (2013.01); *H03M 1/02* (2013.01); *H03M 1/1004* (2013.01); *H03M 1/182* (2013.01); *H03M 1/34* (2013.01); *H03M 3/44* (2013.01); *H03M 3/424* (2013.01); *H03M 3/464* (2013.01)

(58) Field of Classification Search
CPC ........ H03M 1/0626; H03M 1/34; H03M 1/02; H03M 1/182; H03M 1/1004; H03M 3/322; H03M 3/464; H03M 1/00; H03M 1/12; H03M 3/30; H03M 3/454
USPC ................................. 341/118, 143, 155, 142
See application file for complete search history.

(56) References Cited

U.S. PATENT DOCUMENTS 6,275,177 B1   8/2001  Ho
6,642,873 B1 * 11/2003  Kuang .................. H03M 3/424
                                                  341/143

(Continued)

*Primary Examiner* — Khai M Nguyen
(74) *Attorney, Agent, or Firm* — Michelle F. Murray; Charles A. Brill; Frank D. Cimino

(57) ABSTRACT

In some embodiments, an analog-to-digital converter (ADC) comprises a loop filter configured to produce an error signal based on a difference between an analog input signal and a feedback signal. The ADC also comprises a main comparator set comprising one or more main comparators, the main comparator set configured to digitize the error signal and further configured to drive a main digital-to-analog converter (DAC). The ADC further comprises an auxiliary comparator set comprising a plurality of auxiliary comparators, the auxiliary comparator set configured to digitize the error signal when the ADC is in a runaway state and further configured to drive an auxiliary DAC to bring the error signal into a predetermined range.

18 Claims, 2 Drawing Sheets

(56) References Cited

U.S. PATENT DOCUMENTS

| | | | |
|---|---|---|---|
| 7,397,410 B2 * | 7/2008 | Yang | H03M 1/146 |
| | | | 341/155 |
| 7,564,391 B2 | 7/2009 | Das | |
| 7,936,293 B2 * | 5/2011 | Hamashita | H03M 3/42 |
| | | | 341/143 |
| 8,217,816 B2 | 7/2012 | Das | |
| 9,035,813 B2 * | 5/2015 | Miglani | H03M 3/37 |
| | | | 341/143 |
| 9,219,495 B2 * | 12/2015 | Si | H03M 3/322 |
| 2009/0002211 A1 | 1/2009 | Breems et al. | |
| 2014/0240153 A1 | 8/2014 | Das | |

* cited by examiner

NORMALIZING ERROR SIGNAL IN ANALOG-TO-DIGITAL CONVERTER RUNAWAY STATE

CROSS-REFERENCE TO RELATED APPLICATIONS

This application is a continuation of prior application Ser. No. 15/628,462, filed Jun. 20, 2017, currently pending, which is hereby incorporated by reference herein in its entirety, and claims priority to U.S. Provisional Patent Application No. 62/453,550, which was filed on Feb. 2, 2017, is titled "Over-Range Protection for a Sigma-Delta ADC," and is incorporated herein by reference in its entirety.

BACKGROUND

Analog-to-digital converters (ADCs) convert analog signals to digital signals. ADCs are typically powered by voltage supply rails. In certain types of ADCs, such as sigma-delta ADCs, the range of the analog input signal may be substantially smaller than the range of the supply voltage provided by the voltage supply rails. For instance, the analog input voltage may range from −500 mV to +500 mV, and the supply voltage may range from −3 V to +3 V.

SUMMARY

In some embodiments, an analog-to-digital converter (ADC) comprises a loop filter configured to produce an error signal based on a difference between an analog input signal and a feedback signal. The ADC also comprises a main comparator set comprising one or more main comparators, the main comparator set configured to digitize the error signal and further configured to drive a main digital-to-analog converter (DAC). The ADC further comprises an auxiliary comparator set comprising a plurality of auxiliary comparators, the auxiliary comparator set configured to digitize the error signal when the ADC is in a runaway state and further configured to drive an auxiliary DAC to bring the error signal into a predetermined range.

In some embodiments, an analog-to-digital converter (ADC) comprises a plurality of main comparators configured to digitize an error signal based on a plurality of main reference signals. The error signal reflects a difference between an analog input signal to the ADC and a feedback signal generated within the ADC. The ADC also comprises a plurality of auxiliary comparators configured to digitize the error signal based on a plurality of auxiliary reference signals. The auxiliary reference signals have a wider range than a range of the main reference signals. The ADC further includes a main digital-to-analog converter (DAC) configured to produce at least a portion of the feedback signal based on the digitized error signal produced by the plurality of main comparators. The ADC also includes an auxiliary DAC configured to produce at least another portion of the feedback signal based on the digitized error signal produced by the plurality of auxiliary comparators.

In some embodiments, a method comprises receiving an analog input signal at a loop filter, providing a feedback signal to the loop filter, and generating an error signal based on the analog input signal and the feedback signal. The method also includes, as a result of the error signal being outside of a predetermined range, digitizing the error signal using a plurality of main comparators and a plurality of auxiliary comparators. The method further includes driving a main digital-to-analog converter (DAC) using an output of the plurality of main comparators, and driving an auxiliary DAC using an output of the plurality of auxiliary comparators. The feedback signal comprises the output of the plurality of main comparators and the output of the plurality of auxiliary comparators.

BRIEF DESCRIPTION OF THE DRAWINGS

For a detailed description of various examples, reference will now be made to the accompanying drawings in which.

DETAILED DESCRIPTION

As previously explained, in some ADCs (e.g., sigma-delta ADCs), the supply voltage range substantially exceeds the analog input signal range. In such instances, if the supply voltage is substantially higher or substantially lower than the analog input signal, it can dominate the ADC feedback loop. For example, if an integrator output in the loop filter of a sigma-delta modulator is initiated to a value well outside the input signal range, the digital-to-analog controller (DAC) in the feedback loop of the ADC will not have the capability to bring the integrator output back into the normal range. In such a situation, the feedback loop can start oscillating and cease responding to changes in the input signal, including variations in the input signal that are made in an effort to normalize ADC operation. Such a situation is referred to herein as a "runaway" state or mode. When in a runaway state, the ADC is rendered non-functional, because it is unable to properly digitize incoming analog signals. The ADC must be reset to resume normal operation. Such a reset is undesirable at least because the ADC will then require a substantial amount of time to resume normal operation.

Accordingly, at least some embodiments are directed to ADCs that can avoid entering a runaway state and that are able to quickly exit the runaway state without requiring a reset if, for some reason, the ADC does enter a runaway state. (The remainder of this disclosure assumes that the ADC has entered a runaway state and must be removed from the runaway state. However, the techniques used to remove the ADC from the runaway state can also be used to help prevent the ADC from entering the runaway state.) In particular, such embodiments include quantizers that comprise auxiliary comparators to handle loop filter error signals with large absolute values that are present in the runaway state. The outputs of these auxiliary comparators are digital signals that drive an auxiliary digital-to-analog converter (DAC) in the ADC feedback loop. The auxiliary DAC is separate from and in addition to any other DAC. The auxiliary DAC boosts the voltage of the feedback signal against which the loop filter compares the ADC's analog input signal, thus quickly and efficiently normalizing operation of the ADC by reducing the loop filter error signal and removing the ADC from the runaway state.

Figure 1:
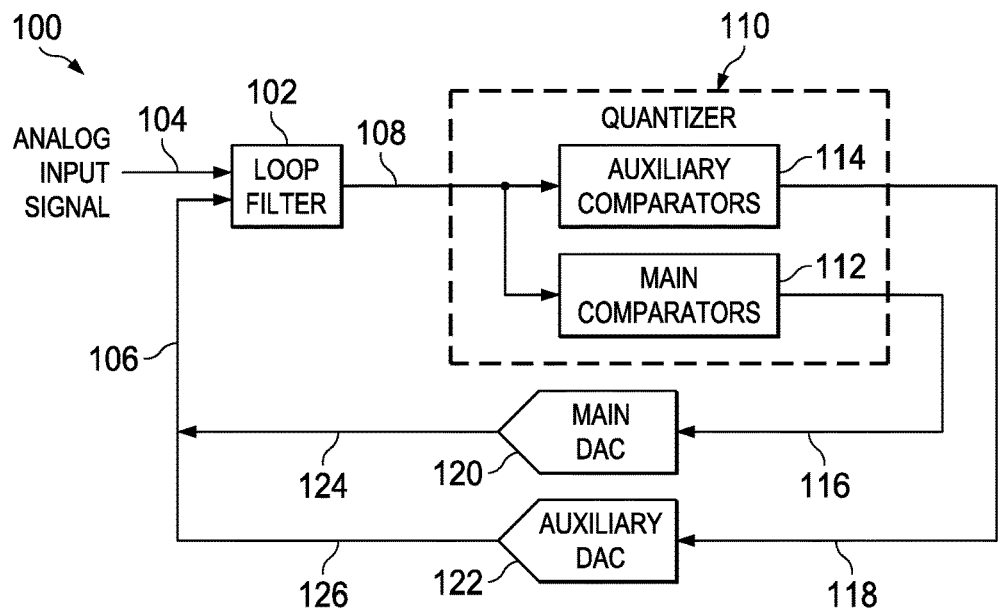
FIG. 1 is a block diagram of an illustrative analog-to-digital converter (ADC).

FIG. 1 is a block diagram of an illustrative analog-to-digital converter (ADC) 100 (e.g., a sigma-delta ADC). In some embodiments, the ADC 100 comprises a loop filter 102 that may include, for instance, a frequency-selective filter and/or an integrator; a quantizer 110 that comprises one or more comparators 112 and one or more auxiliary comparators 114; a main DAC 120; and an auxiliary DAC 122. The loop filter 102 receives an analog input signal 104 and a feedback signal 106. In turn, the loop filter 102 produces an error signal 108 that is provided to the one or more main comparators 112 and the one or more auxiliary comparators 114. The analog input signal 104, the feedback signal 106, and the error signal 108 are analog signals. The one or more main comparators 112 and the one or more auxiliary comparators 114 digitize the error signal 108 and, accordingly, they produce digital codes (e.g., each digital code comprising one or more bits) that are represented in FIG. 1 as digitized error signals 116 and 118. The main DAC 120 receives the digitized error signal 116, and the auxiliary DAC 122 receives the digitized error signal 118. The main DAC 120 provides an output signal 124, and the auxiliary DAC 122 provides an output signal 126. The output signals 124 and 126, which comprise analog signals, combine to form the feedback signal 106. In some embodiments, the ADC 100 includes other components not expressly depicted in FIG. 1, such as and without limitation, digital and decimation filters. In at least some embodiments, the output capacity of the auxiliary DAC 122 is at least as great as, or is greater than, that of the main DAC 124. In some embodiments, multiple auxiliary DACs are used.

In illustrative operation, the loop filter 102 determines a difference between the analog input signal 104 and the feedback signal 106 and produces this difference as the error signal 108. The loop filter 102 applies frequency-weighted filtering and amplification as may be desired and suitable. The error signal 108 comprises an integrated signal as produced by an integrator (not expressly depicted) within the loop filter 102. The error signal 108 is provided to the one or more main comparators 112, hereinafter referred to as the "main comparators" 112. Each of the main comparators 112 may receive a different main reference signal against which to compare the error signal 108. Depending on the results of this comparison, each of the main comparators 112 may output a different digital bit (i.e., a "0" or a "1"). For example, if the error signal 108 is greater than the main reference signal that is received by a particular main comparator 112, that main comparator 112 outputs a "1," and if the error signal is less than or equal to the main reference signal, that main comparator 112 outputs a "0." Other comparison techniques and digital bit schemes are contemplated and included within the scope of this disclosure. If multiple main comparators 112 are used, they together produce a multi-bit digitized error signal 116. If a single main comparator 112 is used, it produces a single-bit digitized error signal 116.

As explained above, ADCs in which the analog input signal range is substantially less than (e.g., no more than 30% of) the supply voltage range is at risk of entering a runaway state, in which the supply voltage causes a wide swing in the feedback signal 106, thus resulting in a wide swing in the error signal 108. Such a wide swing in the error signal 108 may mean that the error signal 108 is higher (e.g., at least 20% greater) than the highest main reference signal provided to any main comparator 112 or lower (e.g., at least 20% lesser) than the lowest main reference signal provided to any main comparator 112. Consequently, in the runaway state, the error signal 108 has an absolute value too large to be canceled by the feedback loop, since the error signal 108 exceeds the capacity of the main DAC. For example, assume that the error signal 108 is 2.5 V. The main reference signals provided to the main comparators 112 are all less than 2.5 V. Accordingly, each of the main comparators 112 outputs a "1." Thus, if there are seven main comparators 112, the collective digitized error signal output by the seven main comparators 112 is 1111111. The main DAC 120 can be configured so that when it receives the maximal output from the main comparators 112 (e.g., 1111111), it provides a predetermined maximum output signal 124. However, this maximum output signal 124 may be insufficient to compensate for the illustrative error signal 108 of 2.5 V. Accordingly, the error signal of 2.5 V causes at least one of the auxiliary comparators to trip because the error signal is greater than at least one of the auxiliary reference signals. For example, if there are two auxiliary comparators 114 in the quantizer 110, and one of them has an auxiliary reference signal of +2 V and the other has an auxiliary reference signal of −2 V, the digitized error signal as output by the auxiliary comparators 114 may be 11. This causes the auxiliary DAC 122 to produce an output signal 126 that increases the feedback signal 106, thus decreasing the differential between the feedback signal 106 and the analog input signal 104 and thereby lowering the error signal 108.

Similarly, if the error signal 108 is relatively low, for instance, −2.5V, the same principle applies. The main comparators 112 may have main reference signals that are all higher than −2.5V, and this causes the main comparators 112 to output a minimal digitized error signal (e.g., in the case of seven main comparators 112, the digitized error signal may be 0000000). However, the output signal 124 produced by the main DAC 120 as a result of the digitized error signal 116 from the main comparators 112 can be insufficiently low. Thus, the absolute value of the error signal 108 remains too high and the ADC 100 remains in a runaway state. However, at least one of the auxiliary comparators 114 receives an auxiliary reference signal that is less than all of the main reference signals (e.g., −2V). As a result, the auxiliary comparators 114 outputs a digitized error signal 118 that causes the auxiliary DAC 122 to produce an output signal 126, which, in turn, causes the feedback signal 106 to decrease. This decrease in the feedback signal 106 causes the differential between the feedback signal 106 and the analog input signal 104 to decrease, thus reducing the absolute value of the error signal 108 and bringing it closer to 0 V. In this way, the ADC 100 presents technical advantages, including the automatic removal of the ADC 100 from a runaway state without requiring a reset of the ADC 100. The precise configurations of the main and auxiliary comparators 112, 114 can vary, as can the digital bit schemes used by these comparators.

Figure 2:
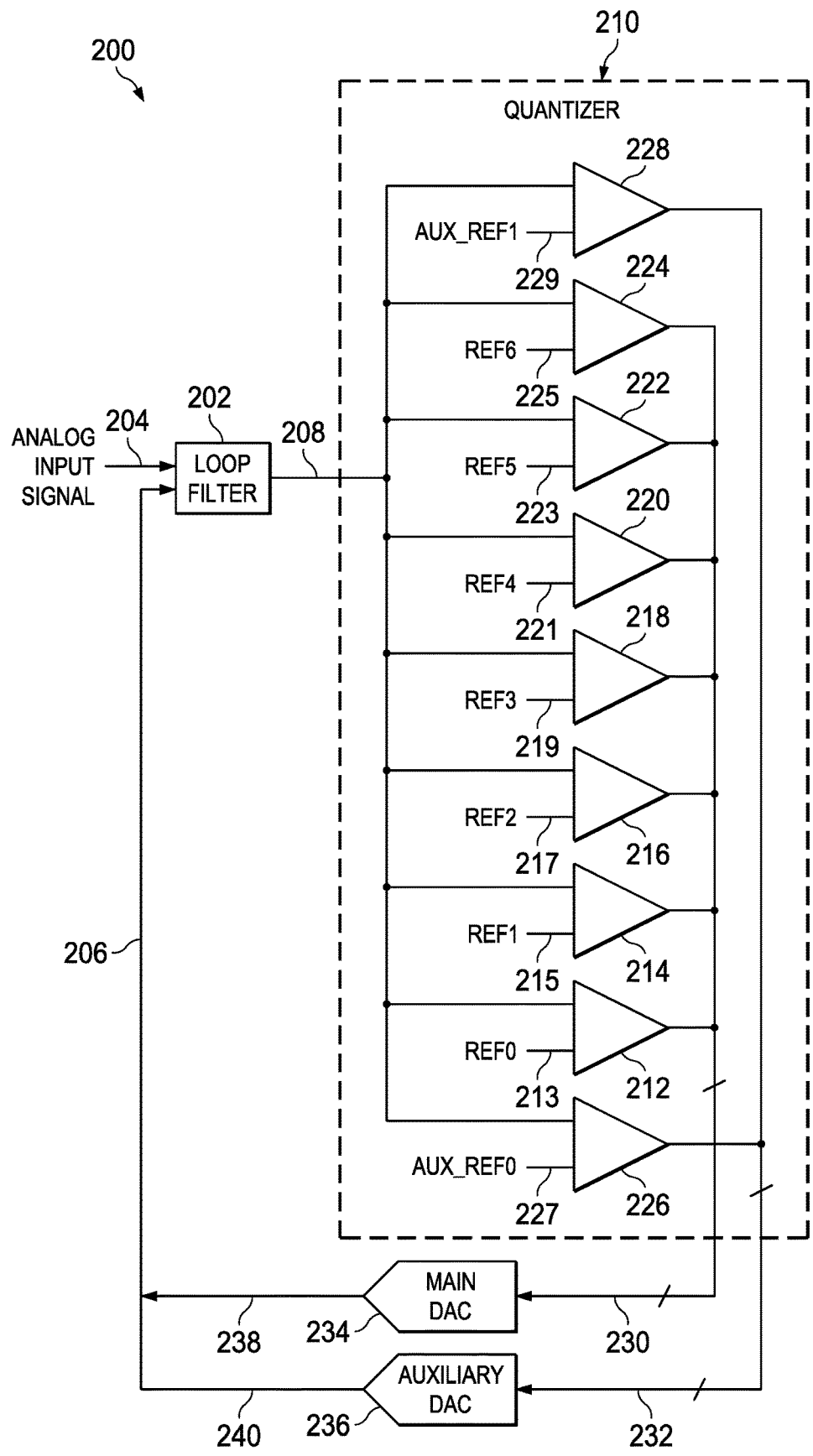
FIG. 2 is a circuit schematic diagram of an illustrative ADC.

FIG. 2 is a circuit schematic diagram of an illustrative ADC 200. The ADC 200 as depicted in FIG. 2 is an illustrative embodiment of the more generic ADC 100 depicted in FIG. 1. In at least some embodiments, the ADC 200 includes a loop filter 202, a quantizer 210, a main DAC 234, and an auxiliary DAC 236. The loop filter 202 receives analog input signal 204 and feedback signal 206, and it outputs an error signal 208. The quantizer 210 comprises main comparators 212, 214, 216, 218, 220, 222, and 224, which receive main reference signals 213, 215, 217, 219, 221, 223, and 225, respectively. One or more main comparators are referred to herein as a "set of main comparators" and a "main comparator set." In some embodiments, the quantizer 210 further comprises auxiliary comparators 226 and 228, which receive auxiliary reference signals 227 and 229, respectively. One or more auxiliary comparators are referred to herein as a "set of auxiliary comparators" and an "auxiliary comparator set." The outputs of the main comparators form a digitized error signal 230 that is input to the main DAC 234, and the outputs of the auxiliary comparators form a digitized error signal 232 that is input to the auxiliary DAC 236. The output signal 238 provided by the DAC 234 combines with the output signal 240 provided by the auxiliary DAC 236 to form the feedback signal 206. In at least some embodiments, the output capacity of the auxiliary DAC 236 is at least as great as, if not greater than, that of the main DAC 234.

The operation of the ADC 200 is similar to that of the ADC 100 depicted in FIG. 1. Illustrative values for the main reference signals 213, 215, 217, 219, 221, 223, and 225 are −1.5V, −1.0V, −0.5V, 0V, +0.5V, +1.0V, and +1.5V, respectively. The auxiliary reference signal 227 illustratively is −2.0V, and the auxiliary reference signal 229 illustratively is +2.0V. If, for instance, the error signal 208 is +2.5V, indicating that the analog input signal 204 is higher than the feedback signal 206 and meaning that the feedback signal 206 needs to be increased, the digitized error signal 230 output by the main comparators may be 1111111, and the digitized error signal 232 output by the auxiliary comparators may be 11. These digitized error signals are provided to the main and auxiliary DACs 234 and 236, respectively. The main and auxiliary DACs 234, 236 are programmed to output maximal signals 238, 240, respectively, when they receive such digitized error signals. The output signal 238 of the main DAC 234, even at maximal levels, may be insufficient to normalize the error signal 208 (i.e., bring the error signal 208 within a predetermined range) and to remove the ADC 200 from a runaway state. However, when combined with the output signal 240 from the auxiliary DAC 236, the feedback signal 208 are significantly increased, thus normalizing the error signal 208 and removing the ADC 200 from the runaway state.

If, for instance, the error signal 208 is −2.5V, indicating that the analog input signal 204 is lower than the feedback signal 206 (due to the possibly sinusoidal nature of the analog input signal 204) and meaning that the feedback signal 206 needs to be decreased, the digitized error signal 230 output by the main comparators can be 0000000, and the digitized error signal 232 output by the auxiliary comparators can be 00. These digitized error signals are provided to the main and auxiliary DACs 234 and 236, respectively. The main and auxiliary DACs 234, 236 are programmed to output minimal (i.e., negative) signals 238, 240, respectively, when they receive such digitized error signals. The output signal 238 of the main DAC 234, even at minimal levels, may be insufficiently negative to normalize the error signal 208 and to remove the ADC 200 from a runaway state. However, when combined with the output signal 240 from the auxiliary DAC 236, the feedback signal 208 is significantly decreased (i.e., made more negative), thus normalizing the error signal 208 and preventing the ADC 200 from entering the runaway state. The final digital output of the ADC 200 is derived from the outputs of the main comparator set. The auxiliary comparators are used exclusively for over-voltage protection, as described above. For this reason, in at least some embodiments, the auxiliary comparators and the auxiliary DAC do not have to be designed as precisely as the main comparators and the main DAC. The digitized error signals provided above are merely illustrative. Any combination of digital bits can be used, as long as they result in the appropriate increase or decrease of the feedback signal 206 to reduce the absolute value of the error signal 208 (i.e., bring the error signal 208 closer to zero). In this way, the ADC 200 presents technical advantages, including the automatic removal of the ADC 200 from a runaway state without requiring a reset of the ADC 200.

Figure 3:
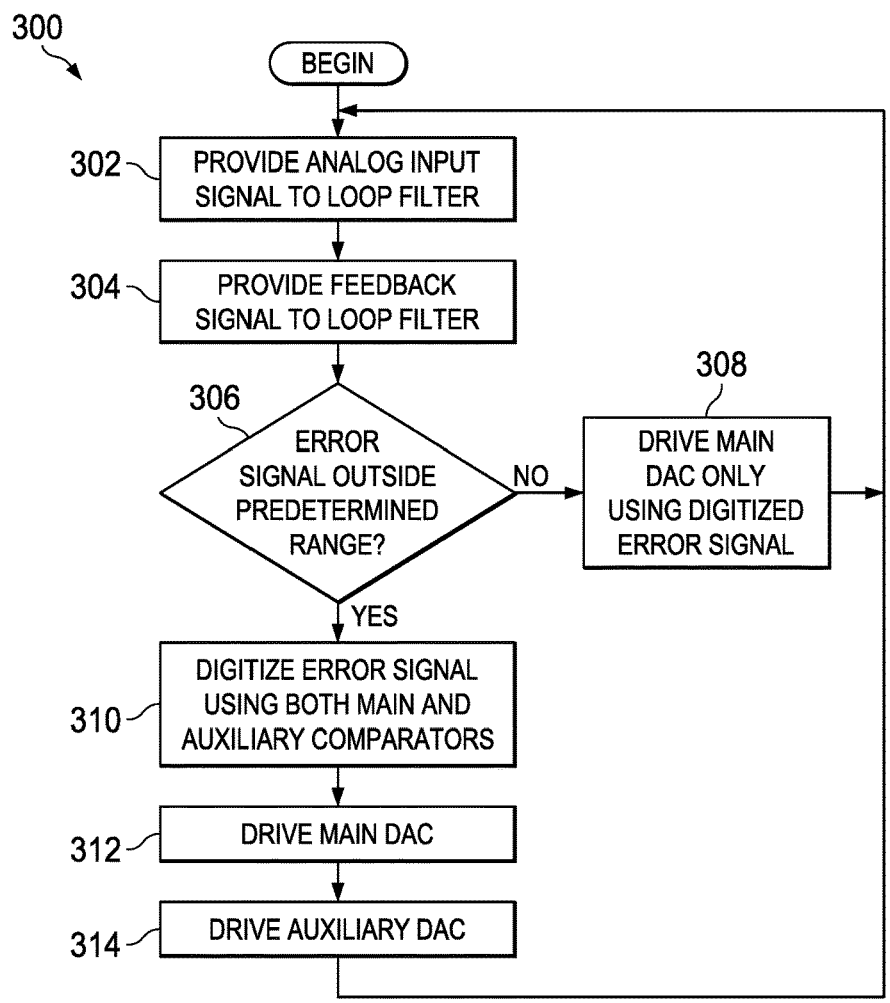
FIG. 3 is a flow diagram of a method for operating an illustrative ADC.

FIG. 3 is a flow diagram of an illustrative method 300 for operating an illustrative ADC in accordance with the various embodiments described herein. The method 300 begins by providing an analog input signal to a loop filter (step 302) and providing a feedback signal to the loop filter (step 304). The loop filters of steps 302, 304 include the loop filters 102, 202 of FIGS. 1 and 2, respectively. The analog input signal of step 302 includes the analog input signals 104, 204 of FIGS. 1 and 2, respectively. The feedback signal of step 304 comprises the feedback signals 106, 206 of FIGS. 1 and 2, respectively.

The method 300 next comprises determining whether the error signal is outside of a predetermined range, e.g., outside the range of the main reference signals provided to the main comparators (step 306). The error signal in step 306 comprises the error signals 108, 208 of FIGS. 1 and 2, respectively, and the main reference signals correspond to, e.g., main reference signals 213, 215, 217, 219, 221, 223, and 225 in FIG. 2. If the result of step 306 is "NO," the method 300 comprises driving only the main DAC (e.g., main DAC 120 in FIG. 1, main DAC 234 in FIG. 2) using the digitized error signal (e.g., digitized error signals 116, 230 in FIGS. 1 and 2, respectively) (step 308). However, in step 308, the auxiliary DAC may not be used. If the result of step 306 is "YES," the method 300 comprises digitizing the error signal using both main and auxiliary comparators (e.g., digitized error signals 116, 118 in FIG. 1; digitized error signals 230, 232 in FIG. 2) (step 310), driving the main DAC (e.g., main DAC 120, 234 in FIGS. 1 and 2, respectively) (step 312), and additionally driving the auxiliary DAC (e.g., auxiliary DAC 122, 236 in FIGS. 1 and 2, respectively) concurrently with the main DAC (step 314). As a result, the error signal normalizes and the ADC is lifted out of the runaway state without requiring a reset of the ADC. The method 300 can be modified as desired, including by adding, deleting, modifying, or rearranging one or more steps.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:
1. A quantizer comprising:
  a main comparator set comprising:
    a first comparator having a first input coupled to receive an error signal, a second input coupled to receive a first reference signal, and an output coupled to output a first bit of a first digitized error signal, the first comparator having a first range having a first maximum value; and
    a second comparator having a first input coupled to receive the error signal, a second input coupled to receive a second reference signal, and an output coupled to output a second bit of the first digitized error signal; and
  an auxiliary comparator set comprising:
    a third comparator having a first input coupled to receive the error signal, a second input coupled to receive a third reference signal, and an output coupled to output a first bit of a second digitized error signal, the third comparator having a second range having a second maximum value, the second maximum value of the second range being greater than the first maximum value of the first range; and
    a fourth comparator having a first input coupled to receive the error signal, a second input coupled to receive a fourth reference signal, and an output coupled to output a second bit of the second digitized error signal.

2. The quantizer of claim 1, wherein the quantizer is configured to receive the error signal from a loop filter.

3. The quantizer of claim 1, wherein the first digitized error signal is configured to drive a main digital-to-analog converter (DAC) and the second digitized error signal is configured to drive an auxiliary DAC.

4. The quantizer of claim 1, wherein the second comparator has the first range and the fourth comparator has the second range.

5. The quantizer of claim 4, wherein a minimum value of the second range is less than a minimum value of the first range.

6. The quantizer of claim 1, wherein the main comparator set further comprises:
a fifth comparator;
a sixth comparator;
a seventh comparator; and
an eighth comparator.

7. A method comprising:
receiving, by a first comparator of a main comparator set of a quantizer, by a second comparator of the main comparator set, by a third comparator of an auxiliary comparator set of the quantizer, and by a fourth comparator of the auxiliary comparator set, an error signal;
receiving, by the first comparator, a first reference signal;
generating, by the first comparator, a first bit of a first digitized error signal based on the error signal and the first reference signal;
receiving, by the second comparator, a second reference signal;
generating, by the second comparator, a second bit of the first digitized error signal, based on the error signal and the second reference signal;
receiving, by the third comparator, a third reference signal;
generating, by the third comparator, a first bit of a second digitized error signal, based on the error signal and the third reference signal;
receiving, by the fourth comparator, a fourth reference signal;
generating, by the fourth comparator, a second bit of the second digitized error signal, based on the error signal and the fourth reference signal;
sending, by the quantizer, the first digitized error signal, to a main digital-to-analog converter (DAC); and
sending, by the quantizer, the second digitized error signal, to an auxiliary DAC.

8. The method of claim 7, wherein receiving the error signal comprises receiving the error signal from a loop filter.

9. The method of claim 7, wherein the first comparator and the second comparator have a first range, the third comparator and the fourth comparator have a second range, and the second range is different than the first range.

10. The method of claim 9, wherein a maximum value of the second range is greater than a maximum value of the first range.

11. The method of claim 9, wherein a minimum value of the second range is less than a minimum value of the first range.

12. An analog-to-digital converter (ADC), comprising:
a quantizer, comprising:
a main comparator set comprising:
a first comparator having a first input coupled to receive an error signal, a second input coupled to receive a first reference signal, and an output coupled to output a first bit of a first digitized error signal; and
a second comparator having a first input coupled to receive the error signal, a second input coupled to receive a second reference signal, and an output coupled to output a second bit of the first digitized error signal; and
an auxiliary comparator set comprising:
a third comparator having a first input coupled to receive the error signal, a second input coupled to receive a third reference signal, and an output coupled to output a first bit of a second digitized error signal; and
a fourth comparator having a first input coupled to receive the error signal, a second input coupled to receive a fourth reference signal, and an output coupled to output a second bit of the second digitized error signal;
a main digital-to-analog converter (DAC) coupled to the quantizer, the main DAC configured to receive the first digitized error signal; and
an auxiliary DAC coupled to the quantizer, the auxiliary DAC configured to receive the second digitized error signal.

13. The ADC of claim 12, wherein the main DAC is configured to generate a first analog output signal based on the first digitized error signal and the auxiliary DAC is configured to generate a second analog output signal based on the second digitized error signal.

14. The ADC of claim 13, further comprising a loop filter coupled to the quantizer, to the main DAC, and to the auxiliary DAC, wherein the loop filter is configured to:
receive a feedback signal comprising a combination of the first digitized error signal and the second digitized error signal; and
receive an analog input signal.

15. The ADC of claim 14, wherein the loop filter is further configured to generate the error signal based on a difference between the analog input signal and the feedback signal.

16. The ADC of claim 12, wherein the first comparator and the second comparator have a first range, the third comparator and the fourth comparator have a second range, and the second range is different than the first range.

17. The ADC of claim 16, wherein a maximum value of the second range is greater than a maximum value of the first range.

18. The ADC of claim 16, wherein a minimum value of the second range is less than a minimum value of the first range.

* * * * *